United States Patent [19]

Van Opdorp et al.

[11] 4,280,858
[45] Jul. 28, 1981

[54] METHOD OF MANUFACTURING A SEMICONDUCTOR DEVICE BY RETARDING THE DIFFUSION OF ZINC OR CADMIUM INTO A DEVICE REGION

[75] Inventors: Christianus J. M. Van Opdorp; Hendrik Veenvliet, both of Eindhoven, Netherlands

[73] Assignee: U.S. Philips Corporation, New York, N.Y.

[21] Appl. No.: 91,428

[22] Filed: Nov. 5, 1979

[30] Foreign Application Priority Data

Nov. 29, 1978 [NL] Netherlands ..................... 7811683

[51] Int. Cl.³ .................... H01L 21/20; H01L 21/22
[52] U.S. Cl. .................................. 148/175; 29/578; 148/187; 148/188; 148/190; 331/94.5 H; 357/16; 357/18
[58] Field of Search .............. 148/175, 187, 188, 190; 29/569 L, 578; 357/16, 17, 18; 331/94.5 H

[56] References Cited

U.S. PATENT DOCUMENTS

| | | | |
|---|---|---|---|
| 3,852,127 | 12/1974 | Lamming | 148/187 |
| 3,920,491 | 11/1975 | Yonezo | 148/175 |
| 3,959,808 | 5/1976 | King | 357/18 |
| 3,961,996 | 6/1976 | Namizaki et al. | 148/175 X |
| 4,011,113 | 3/1977 | Thompson et al. | 148/175 |
| 4,055,443 | 10/1977 | Akimov et al. | 148/187 X |
| 4,132,960 | 1/1979 | Streifer et al. | 357/18 X |
| 4,154,630 | 5/1979 | Diguet et al. | 148/175 X |
| 4,183,038 | 1/1980 | Namizaki et al. | 357/18 X |
| 4,203,079 | 5/1980 | Thompson et al. | 357/18 X |

FOREIGN PATENT DOCUMENTS

1503678 3/1978 United Kingdom.

OTHER PUBLICATIONS

Dumke, W. P., "Simple Planar Double-Heterojunction Laser Structure", I.B.M. Tech. Discl. Bull., vol. 16, No. 4, Sep. 1973, p. 1186.

Kobayashi et al., "Unstable Horizontal ... Stripe Structure", IEEE J. Quantum Electronics, vol. QE-13, No. 8, Aug. 1977, pp. 659-661.

Primary Examiner—L. Dewayne Rutledge
Assistant Examiner—W. G. Saba
Attorney, Agent, or Firm—Thomas A. Briody; Robert T. Mayer; Paul R. Miller

[57] ABSTRACT

A semiconductor device and a method for manufacturing the semiconductor device are disclosed for forming an abrupt and accurately positioned p-n junction between a substrate and a substrate-adjoining region. This is achieved in accordance with the present invention by diffusing zinc or cadmium from a surface of the substrate-adjoining region to the substrate, and abruptly limiting or retarding the diffusion of the zinc or cadmium into the substrate near a junction between the substrate and the region. This is accomplished in accordance with the present invention by selecting the net donor concentration in the substrate near the junction to be higher than the concentration of zinc or cadmium at the surface of the substrate-adjoining region.

10 Claims, 1 Drawing Figure

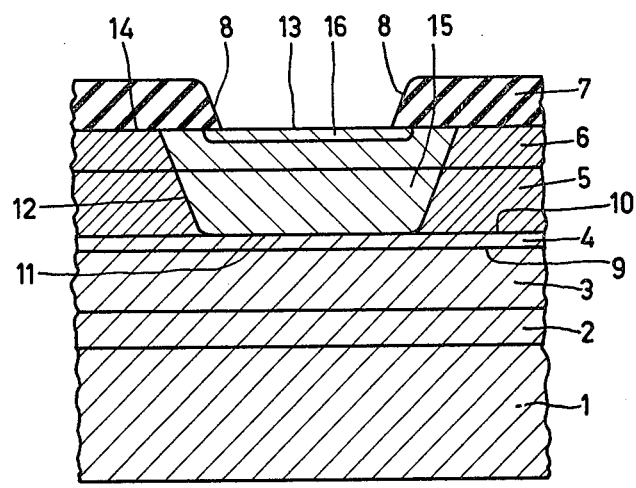

METHOD OF MANUFACTURING A SEMICONDUCTOR DEVICE BY RETARDING THE DIFFUSION OF ZINC OR CADMIUM INTO A DEVICE REGION

The invention relates to a method of manufacturing a semiconductor device comprising a body which consists of semiconductor material of the III-V compound type and which is formed by an n-type substrate and a substrate-adjoining region having conductivity properties differing from the substrate, zinc or cadmium being introduced at least over a part of the surface of the region into the region and being diffused to the substrate, and to a semiconductor device manufactured by means of the method.

Semiconductor material of the III-V compound type is to be understood to mean herein material consisting of compounds of one or more elements belonging to group IIIB with one or more elements of group VB of the periodic table of elements.

It is to be noted that the region may have a chemical composition different from that of the substrate and may consist of several layers and that the substrate itself may consist of a starting body on which epitaxial layers have been grown.

The difference in conductivity properties between the region and the substrate may consist of a difference in electrical conductivity and/or difference in conductivity type.

Introduction of cadmium or zinc may take place, for example, by deposition and diffusion from an adjoining phase or by ion implantation.

A method of the kind mentioned in the opening paragraph is known, for example, from British Patent Specification No. 1,503,678.

In this specification the region is a heteroepitaxial layer having a larger forbidden bandwidth than that of the substrate and of the same conductivity type as the substrate. By diffusion of zinc into the substrate a light-emissive diode is obtained having a p-n junction situated in the substrate so as to cause recombination of charge carriers to take place in the redoped part of the substrate as much as possible.

In the manufacture of semiconductor devices having p-n junctions in III-V materials, often several requirements have to be fulfilled simultaneously, for example, that the p-n junction must be abrupt, that the position of the p-n junction must be accurately determined, for example, must coincide with a hetero junction, for example, in a p-n laser, and that the p-n junction must be local.

In practice it is particularly difficult to satisfy these requirements simultaneously.

For example, an abrupt and accurately positioned p-n junction can be obtained by rapidly switching during the epitaxial growth from donor to acceptor incorporation. However, laterally bounded incorporation of an impurity is not possible in epitaxy.

Incorporation of acceptors by diffusion may result in local doping but generally not in abrupt and accurately positioned p-n junctions.

One of the objects of the invention is to avoid the disadvantages of the described methods at least to a considerable extent. It is based inter alia on the recognition that for this purpose diffusion may be used provided the anomal character of the diffusion of zinc and cadmium in III-V materials is used.

According to the invention, the method mentioned in the opening paragraph is therefore characterized in that the net donor concentration in the substrate near the junction between the region and the substrate is chosen to be so high that the diffusion of zinc or cadmium in the substrate near the junction between the region and the substrate is retarded.

Nearly all the zinc or cadmium ions provided in a III-V body are present as immobile acceptors on substitutional lattice places $M_S^-$ (M = zinc or cadmium), while the diffusion takes place substantially only through small numbers or interstitial zinc of cadmium donors $M_i^+$.

An equilibrium locally adjusts rapidly between the interstitial donors and substitutional acceptors according to

$$M_i^+ + e + V_{III} \rightleftarrows M_S^- + h$$

wherein e is an electron, h is a hole and $V_{III}$ is a vacancy of the IIIB element.

Zinc or cadmium which diffuses to the n-type substrate by interstitial places is confronted by a high electron concentration and is immobilized in substitutional places.

The abruptness of the junction is particularly clear if at the surface from which the diffusion is carried out the concentration of the zinc or cadmium is smaller than tenfold, and in particular smaller than threefold, of the net donor concentration in the substrate near the junction between the region and the substrate.

The junction is very readily positioned namely at the junction between the region and the substrate, if at the surface from which the diffusion is carried out the concentration of the zinc or cadmium is smaller than the net donor concentration in the substrate near the junction between the region and the substrate.

From the above it will be obvious that the conductivity properties of the region must be such that diffusion, through the region is manifest. This means that if the region originally is of the p conductivity type, the original net zinc or cadmium concentration of the region must be smaller than the net donor concentration of the substrate. The region may also be intrinsic. When the region is of the n conductivity type, the concentration of the diffusing zinc or cadmium must be significantly larger than the net donor concentration in the region.

This can be explained as follows. Roughly speaking, the variation of the concentration in the region of the zinc or cadmium as a function of the distance to the surface from which the diffusion is carried out shows a negative curve, in other words, is concave with respect to the distance axis. Accordingly, the concentration variation at the diffusion front is steeper than at the surface from which the diffusion is carried out. Diffusion of zinc or cadmium in a region of the n conductivity type is not noticeably inhibited by substitutional immobilisation as long as the concentration of the zinc or cadmium is significantly larger, for example, is tenfold of the net donor concentration in the region.

The concentration of the zinc or cadmium at the surface from which the diffusion is carried out is preferably larger than tenfold of the net donor concentration in the region and the net donor concentration in the region is smaller than the tenth part of the net donor concentration in the substrate near the junction between the region and the substrate.

The region is preferably obtained by epitaxial growth of a layer on the substrate because as a result of the difference of doping between the region and the substrate an abrupt and accurately localized junction can be obtained.

Upon diffusion of zinc or cadmium in an n-type layer to obtain the region, an insulating p-n junction is obtained automatically between the region and the remainder of the epitaxial layer and a p-n junction between the region and the substrate.

After the diffusion of zinc or cadmium, a second shallow diffusion of zinc or cadmium is preferably carried out to obtain a low-ohmic contacting zone in the region.

The invention will now be described in greater detail with reference to an embodiment and the accompanying drawing.

The FIGURE in the drawing is a diagrammatic sectional view of a part of the semiconductor device at a stage of manufacture by means of the method according to the invention.

The example describes the manufacture of a laser device comprising a body 1, 2, 3, 4, 5, 6 which consists of semiconductor material of the III-V compound type and is formed by an n-type substrate 1, 2, 3, 4 and a substrate-adjoining region 5, 6 having conductivity properties differing from those of the substrate.

During manufacture, zinc or cadmium is introduced at least over a part 13 of a surface 14 of the region 5, 6 into the region and is diffused to the substrate 1, 2, 3, 4.

According to the invention the net donor concentration in the substrate 1, 2, 3, 4 near the junction 10 between the region and the substrate is chosen to be so high that diffusion of zinc or cadmium in the substrate near the junction 10 between the region 5, 6 and the substrate 1, 2, 3, 4 is retarded.

At the surface 14 from which the diffusion is carried out the concentration of zinc or cadmium is preferably smaller than tenfold, for example, smaller than threefold, of the net donor concentration or even smaller than the net donor concentration in the substrate near the junction between the region and the substrate.

If the region 5, 6 near the surface 14 from which the diffusion is carried out is n-type, the concentration of zinc or cadmium is preferably larger than tenfold of the net donor concentration in the region.

The substrate 1, 2, 3, 4 is obtained, for example, by starting from a gallium arsenide body 1 which has obtained the n-conductivity type by doping with $2 \cdot 10^{18}$ silicon atoms per $cm^3$.

On the body 1 are grown in a usual manner by means of, for example, gaseous phase epitaxy, a 0.5 $\mu$m thick n-type gallium arsenide layer 2, doped with $10^{18}$ selenium atoms per $cm^3$, a 1 $\mu$m thick n-type aluminium gallium arsenide layer 3 ($Al_{0.3}Ga_{0.7}As$) doped with $5 \cdot 10^{17}$ selenium atoms per $cm^3$, and a 0.16 $\mu$m thick n-type gallium arsenide layer 4 doped with $10^{18}$ selenium atoms per $cm^3$.

The region 5, 6 consisting of non-advertently doped, weakly p-type layers of high electrical resistance is then formed on the layer 4 of the substrate 1, 2, 3, 4. For this purpose, a 1 $\mu$m thick aluminium gallium arsenide layer 5 ($Al_{0.3}Ga_{0.7}As$) and a 0.5 $\mu$m thick gallium arsenide layer 6 are grown successively by means of gaseous phase epitaxy.

Layer 4 is the active layer of the laser device and constitutes hetero junctions 9 and 10 with the layers 3 and 5, respectively.

The surface 14 is then provided with a silicon nitride layer 7 and a diffusion mask for zinc. A window 8 is provided in the layer 7 so that the part 13 of the surface 14 is exposed. Zinc is introduced into the layer 6 in a usual manner through the surface part 13 in such manner that the concentration of zinc at the surface in the layer 6 is $5 \cdot 10^{17}$ atoms per $cm^3$. By diffusion of zinc to the substrate a p-type region 15 is formed which is bounded by the junction 12 to adjoining parts of the region 5, 6 and by the p-n junction 11 to the substrate 1, 2, 3, 4. The p-n junction 11 coincides with a part of the hetero junction 10.

After the described diffusion of zinc, a second shallow diffusion of zinc may be carried out to obtain a low-ohmic contact zone 16 in the region 5, 6. The zinc concentration at the surface 14 in the zone 6 is, for example, $10^{20}$ atoms per $cm^3$.

Starting material may be a body in which a large number of p-type regions 15 are formed so that active regions in the layer 4 are determined. Such an assembly is processed in a usual manner to form laser devices.

The laser devices manufactured by means of the method according to the invention are distinguished by the accuracy and reproducibility of their lateral boundary and of their active region thickness.

The invention is not restricted to the embodiment described. Many variations are possible within the scope of the invention.

In addition to laser devices, light emissive diodes may be manufactured having abrupt p-n homo junctions to improve unilateral injection or devices having a hetero structure in which electro absorption effects play a role.

The region through which diffusion is carried out need not be p-type as in the example. For example, zinc diffuses rapidly through a gallium phosphide region having a net donor concentration of $10^{17}$ atoms per $cm^3$ when the zinc concentration at the surface of this region is $4 \cdot 10^{18}$ atoms per $cm^3$, but at this surface concentration does not diffuse noticeably into a gallium phosphide substrate having a net donor concentration of $10^{19}$ atoms per $cm^3$.

Zinc can also be implanted in a usual manner through the surface part 13.

What is claimed is:

1. A method of manufacturing a semiconductor device including a body of III-V compound type semiconductor material comprising the steps of forming an n-type substrate and a substrate-adjoining region having conductivity properties differing from said substrate, introducing zinc or cadmium into said region over at least a part of a surface of said region away from said substrate, diffusing said zinc or cadmium to said substrate, and retarding diffusion of said zinc or cadmium into said substrate near a junction between said substrate and said region by selecting the net donor concentration in said substrate near said junction to be high.

2. A method according to claim 1, wherein said net donor concentration in said substrate near said junction is chosen to be higher than concentration of said zinc or cadmium at said part of said surface of said region.

3. A method according to claim 2, wherein said concentration of said zinc or cadmium at said part of said surface of said region is chosen to be higher than the net donor concentration of said region.

4. A method according to claim 1, wherein said net donor concentration in said substrate near said junction is chosen to be higher than the net donor concentration of said region.

5. A method according to claim 1, wherein said concentration of said zinc or cadmium at said part of said surface of said region is smaller than tenfold of said net donor concentration in said substrate near said junction.

6. A method according to claim 5, wherein said concentration of said zinc or cadmium at said part of said surface of said region is smaller than threefold of said net donor concentration in said substrate near said junction.

7. A method according to claim 6, wherein said concentration of said zinc or cadmium at said part of said surface of said region is smaller than said net donor concentration in said substrate near said junction.

8. A method according to claim 7, wherein said concentration of said zinc or cadmium at said part of said surface of said region is larger than tenfold of the net donor concentration of said region, and said net donor concentration of said region is smaller than the tenth part of said net donor concentration in said substrate near said junction.

9. A method according to claim 1, wherein said region is formed by epitaxial growth of at least one layer on said substrate.

10. A method according to claim 1, wherein a second shallow diffusion of zinc or cadmium is carried out in said region after said first step of diffusing zinc or cadmium in said region in order to form a low-ohmic contact zone in said region by said second diffusion.

* * * * *